(12) United States Patent
Narita

(10) Patent No.: US 8,778,803 B2
(45) Date of Patent: Jul. 15, 2014

(54) CPM SLURRY FOR SILICON FILM POLISHING AND POLISHING METHOD

(75) Inventor: Takenori Narita, Mito (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 537 days.

(21) Appl. No.: 12/678,777

(22) PCT Filed: Jun. 6, 2008

(86) PCT No.: PCT/JP2008/060460
§ 371 (c)(1),
(2), (4) Date: Mar. 18, 2010

(87) PCT Pub. No.: WO2009/037903
PCT Pub. Date: Mar. 26, 2009

(65) Prior Publication Data
US 2010/0210184 A1 Aug. 19, 2010

(30) Foreign Application Priority Data

Sep. 21, 2007 (JP) .............. P2007-245354
Dec. 27, 2007 (JP) .............. P2007-337158

(51) Int. Cl.
*H01L 21/302* (2006.01)

(52) U.S. Cl.
USPC ........... 438/693; 216/89; 262/79.1; 262/79.2; 262/79.3; 262/79.4; 438/689; 438/690; 438/691; 438/692

(58) Field of Classification Search
USPC ............ 252/79.1–79.4; 216/89; 438/689–692
See application file for complete search history.

(56) References Cited

U.S. PATENT DOCUMENTS

| | | | |
|---|---|---|---|
| 6,478,977 B1 * | 11/2002 | Moriyama et al. | 216/52 |
| 6,530,968 B2 | 3/2003 | Tsuchiya et al. | |
| 7,005,382 B2 | 2/2006 | Nishimoto et al. | |
| 7,554,199 B2 * | 6/2009 | Narita et al. | 257/752 |
| 2004/0132305 A1 * | 7/2004 | Nishimoto et al. | 438/690 |

FOREIGN PATENT DOCUMENTS

| | | |
|---|---|---|
| EP | 1198534 | * 10/2004 |
| JP | 03-136766 | 6/1991 |
| JP | 2001-135601 | 5/2001 |
| JP | 3457144 | 8/2003 |
| JP | 2004-64072 | 2/2004 |
| JP | 2004-266155 | 9/2004 |
| JP | 2005-64285 | 3/2005 |
| JP | 2005-175498 | 6/2005 |
| JP | 2006-190750 | 7/2006 |

(Continued)

OTHER PUBLICATIONS

Akitoshi et al. (JP2001135601 (A) English Machine Translation.*

(Continued)

*Primary Examiner* — Nadine Norton
*Assistant Examiner* — Maki Angadi
(74) *Attorney, Agent, or Firm* — Antonelli, Terry, Stout & Kraus, LLP.

(57) ABSTRACT

Disclosed is a CMP slurry for silicon film polishing, comprising abrasive grains, an oxidizing agent, a cationic surfactant, and water. This CMP slurry is suitable for the CMP step of a silicon film of semiconductor devices, since it enables to obtain excellent planarity and excellent performance of controlling the remaining film thickness, while improving the yield and reliability of the semiconductor devices. This CMP slurry also enables to reduce the production cost.

13 Claims, 6 Drawing Sheets

(a) CROSS SECTION AFTER UNDERLAY IS MADE UNCOVERED (b) CROSS SECTION BEFORE UNDERLAY IS MADE UNCOVERED

(56) References Cited

FOREIGN PATENT DOCUMENTS

| | | |
|---|---|---|
| JP | 2006-344786 | 12/2006 |
| JP | 2007-180451 | 7/2007 |
| KR | 2002-0040636 | 5/2002 |
| KR | 2004-0000236 | 1/2004 |
| KR | 10-2004-0038882 | 5/2004 |
| TW | 296282 | 5/2008 |

OTHER PUBLICATIONS

KR Official Action dated Oct. 18, 2011, for KR Application No. 10-2010-7004850.

Taiwanese Official Action dated Feb. 22, 2012, for TW Application No. 10120175790.

Japanese Official Action dated Mar. 6, 2012, for JP Application No. 2009-533081.

Translation of the Preliminary Report on Patentability mailed Apr. 15, 2010, for Application No. PCT/JP2008/060460.

Japanese Official Action dated Nov. 6, 2012, for JP Application No. 2009-533081.

Taiwanese Official Action dated Sep. 4, 2012, for TW Application No. 097122580.

Korean Official Action dated Jun. 21, 2012, for KR Application No. 10-2010-7004850.

Korean Official Action dated May 30, 2013, for KR Application No. 10-2012-7021740.

* cited by examiner (a) PLAN VIEW (b) SECTIONAL VIEW (a) CROSS SECTION AFTER UNDERLAY IS MADE UNCOVERED (b) CROSS SECTION BEFORE UNDERLAY IS MADE UNCOVERED (a) CASE WHERE POLISHING IS PERFORMED UNTIL UNDERLAY IS MADE UNCOVERED (b) CASE WHERE POLISHING IS AUTOMATICALLY STOPPED BEFORE UNDERLAY IS MADE UNCOVERED (a) PLAN VIEW (b) SECTIONAL VIEW 1

(c) SECTIONAL VIEW 2

CPM SLURRY FOR SILICON FILM POLISHING AND POLISHING METHOD

TECHNICAL FIELD

The present invention relates to a slurry for silicon film polishing which is suitable for the CMP (chemical mechanical polishing) of a silicon film in the production of a semiconductor element so as to give an excellent planarity, and a polishing method using the slurry.

BACKGROUND ART

In the step of forming contact plugs of DRAMs or in the step of forming floating gates in flash memories, the CMP of a silicon film is used, examples of the film including a polysilicon film, and an amorphous silicon film. About such semiconductor elements, requirements for the planarity thereof after CMP have been becoming severer because of promoting miniaturization. Thus, it has been becoming difficult that conventional slurries for silicon film polishing give a sufficient planarity.

As illustrated in FIG. 5, in the step of forming contact plugs in DRAMs, an inter-gate insulating film 7 buried between gate structures 3 is etched to make openings, thereby making contact holes. Thereafter, an electroconductive material 8, for contact plug, is deposited thereon. As the contact plug electroconductive material 8, polysilicon, amorphous silicon or the like is used. Next, unnecessary portions of the contact plug electroconductive material 8 are removed by CMP to form the contact plugs, as illustrated in FIG. 6. In this CMP step, in order for the unnecessary portions of the contact plug electroconductive material 8 not to remain on the gate structures 3 or on the inter-gate insulating film 7, it is necessary to perform over-polishing. At this time, in the contact hole regions, which are opening regions in the inter-gate insulating film 7, the contact plug electroconductive material 8 is excessively polished so that the tops of the contact plugs turn into a concave form. Thus, dishing or erosion is generated to damage the planarity. A deterioration in the planarity by the dishing results in a scattering in the height of the contact plugs, so as to cause a fall in the margin of lithography, polish residues in the CMP, and others. Thus, a fall in the yield is caused.

The following will describe a method for forming floating gates in flash memories by use of CMP. Any figure group out of FIG. 7 to FIG. 9 illustrates a plan view and sectional views in each of steps of the formation of the floating gates by use of CMP. In the sectional views, cross sections of a cross section 1 and a cross section 2 shown in the plan view, which are taken along two directions, are illustrated.

A diffusion layer (not illustrated) is formed on a surface of a silicon substrate 1, and subsequently an element isolation insulating film 20 that is formed on the whole of the substrate surface is worked by dry etching, using a photoresist pattern as a mask, to remove unnecessary portions of the resist. The thickness of the element isolation insulating film 20 is from about 50 to 200 nm. In FIG. 7 is illustrated a state that a gate insulating film 2 is afterwards formed on the uncovered surface of the silicon substrate 1.

FIG. 8 illustrate cross sections after a silicon film 30 for floating gates is formed by CVD (chemical vapor deposition). For the silicon film 30, polysilicon or amorphous silicon is used. The film thickness of the silicon film 30 is set to about two times that of the element isolation insulating film 20. Also after the silicon film 30 is formed, steps of the pattern of the element isolation insulating film 20 are kept as they are. When a photoresist pattern for working the silicon film 30 is formed in the state that the film 20 has these steps, a poorness in the resolution of the pattern, or the like is easily caused. In the case of semiconductor devices made minute, the poorness or the like causes a fall in the yield thereof. As illustrated in the cross section 1 in FIG. 8($b$), the silicon film 30 is made into a conformal form; therefore, the film thickness of side wall portions of the pattern of the element isolation film 20 becomes large in the vertical direction. For this reason, when the silicon film is worked by anisotropic dry etching, an etch residue is easily generated in the side wall portions of the pattern of the element isolation insulating film 20 to cause a short circuit easily between gates. In order to remove this etch residue, over-etching is performed; however, when the period therefor is made long, the gate insulating film 2, which is thin, is damaged so that the reliability of the device is declined. In the case of semiconductor devices made minute, such a problem is serious.

In order to avoid such a problem, suggested is a method of removing convexes of the silicon film 30 by CMP. FIG. 9 illustrate a state of the silicon film 30 after the CMP. At this time, the convexes of the silicon film 30 regions on the element isolation insulating film 20 are removed. It is however necessary to make the element isolation insulating film 20 into a covered state. The remaining film thickness of the silicon film 30 regions on the element isolation insulating film 20 is about ¼ to ½ of the film thickness of the element isolation insulating film 20.

In the state that the silicon film 30 is planarized in this manner, a pattern of a photoresist 40 is formed (FIG. 10) and the workpiece is worked by anisotropic dry etching (FIG. 11), thereby making it possible to avoid a poorness in the resolution of the photoresist pattern, a short circuit between the gates on the basis of the etch residue, a decline in the reliability of the gate insulating film by over-etching, and other problems.

In a CMP step of a silicon film in a semiconductor element, the following two cases are adopted: a case where the CMP is performed until an underlay (for example, a gate structure and an inter-gate insulating film) is made uncovered in the step of forming contact plugs, as descried above; and a case where the polishing is stopped after irregularities in the substrate surface are cancelled in the step of forming floating gates and before an underlay (for example, an element isolation insulating film) thereof is made uncovered. About any use application, requests for the planarity of a polished surface have been increasingly becoming severer in order to make its elements minuter. Therefore, it has been intensely desired to develop a slurry having a better step-canceling performance, over-etching resistance and performance of controlling the remaining film thickness than conventional slurries.

Japanese Patent No. 3457144 discloses, as a silicon-film-polishing slurry, a composition for polysilicon polishing which contains a basic organic compound. This polishing composition has a large polishing rate for a polysilicon film. Thus, the polishing rate thereof is larger in the polishing of a polysilicon film than in the polishing of a silicon dioxide film. However, the planarity of the surface polished therewith is insufficient. Thus, it is difficult that the slurry copes with LSIs made minuter. Japanese Patent Application Laid-Open (JP-A-) No. 2005-175498 discloses, a different silicon-film-polishing slurry, a polishing slurry composition containing a nonionic surfactant to improve the planarity of a polished surface. However, this polishing slurry composition is expected not to give a sufficient planarity, either, since the capability of the nonionic surfactant to protect the surface of a silicon film is insufficient.

About the silicon-film-polishing slurries described in the documents, it is presupposed that CMP is performed until an oxide film or nitride film as an underlay is made uncovered. Thus, it is difficult to control the remaining film thickness when CMP is stopped without making the underlay uncovered.

DISCLOSURE OF THE INVENTION

An object of the present invention is to provide a CMP slurry for silicon film polishing that is very good in the planarity of a surface polished therewith and the performance of controlling the remaining film thickness, and a polishing method using the slurry.

Means for Solving the Problems

The invention relates to (1) a CMP slurry for silicon film polishing, comprising abrasive grains, an oxidizing agent, a cationic surfactant, and water.

The invention also relates to (2) the CMP slurry for silicon film polishing according to item (1), wherein the cationic surfactant is at least one selected from aliphatic amines, monoalkyltrimethylammonium salts, methonium dihydroxides, and salts thereof.

The invention also relates to (3) the CMP slurry for silicon film polishing according to item (1) or (2), wherein the oxidizing agent is hydrogen peroxide.

The invention also relates to (4) the CMP slurry for silicon film polishing according to any one of items (1) to (3), which has a pH within the range of 4 to 10.

The invention also relates to (5) the CMP slurry for silicon film polishing according to any one of items (1) to (4), wherein the content of the oxidizing agent is from 0.1 to 20.0 parts by mass relative to 100 parts by mass of the CMP slurry for silicon film polishing.

The invention also relates to (6) the CMP slurry for silicon film polishing according to any one of items (1) to (5), wherein the content of the cationic surfactant is from 0.0001 to 0.1 parts by mass relative to 100 parts by mass of the CMP slurry for silicon film polishing.

The invention also relates to (7) the CMP slurry for silicon film polishing according to any one of items (1) to (6), wherein a film to be polished is a polysilicon film or an amorphous silicon film.

The invention also relates to (8) a polishing method for a substrate, comprising the steps of:
pushing and pressing a substrate having a film to be polished against a polishing cloth of a polishing table, the film to be polished being formed on the substrate; and
polishing the film to be polished by moving the substrate having the film to be polished and the polishing table, while supplying a CMP slurry for silicon film polishing as recited in any one of items (1) to (7) between the film to be polished and the polishing cloth.

The invention also relates to (9) a polishing method for a substrate, wherein the substrate comprises: an underlay comprising concaves and convexes; and a silicon film covering the underlay along its surface,
comprising the step of polishing the silicon film to make the convexes of the underlay uncovered,
wherein a CMP slurry for silicon film polishing as recited in any one of items (1) to (7) is used to perform the polishing.

The invention also relates to (10) the polishing method according to item (9), wherein the content of the oxidizing agent is from 0.1 to 5.0 parts by mass relative to 100 parts by mass of the CMP slurry for silicon film polishing.

The invention also relates to (11) a polishing method for a substrate, wherein the substrate comprises: an underlay comprising concaves and convexes; and a silicon film formed on the underlay,
comprising the steps of polishing the silicon film; and
stopping the polishing before the underlay is made uncovered,
wherein a CMP slurry for silicon film polishing as recited in any one of items (1) to (7) is used to perform the polishing.

The invention also relates to (12) the polishing method according to item (11), wherein the content of the oxidizing agent is from 03 to 20.0 parts by mass relative to 100 parts by mass of the CMP slurry for silicon film polishing.

The invention also relates to (13) a polishing method for a silicon film of a substrate, wherein the substrate has concaves and convexes, and has the silicon film, the film thickness thereof to be polished being a film thickness more than the double of an initial step difference between the concaves and the convexes,
comprising the steps of: a first step of polishing the silicon film until the remaining film thickness of the silicon film becomes from 0.5 to 1.5 times the initial step difference by using a CMP slurry for silicon film polishing as recited in any one of items (1) to (7) wherein the content of the oxidizing agent is low; and
a second step of polishing the silicon film by using a CMP slurry for silicon film polishing as recited in any one of items (1) to (7) wherein the content of the oxidizing agent is high.

The invention also relates to (14) the polishing method according to item (13), wherein the content of the oxidizing agent is less than 0.1 part by mass relative to 100 parts by mass of the CMP slurry for silicon film polishing, used in the first step,
and the content of the oxidizing agent is from 0.1 to 20.0 parts by mass relative to 100 parts by mass of the CMP slurry for silicon film polishing, used in the second step.

BEST MODE FOR CARRYING OUT THE INVENTION

Figure 1:
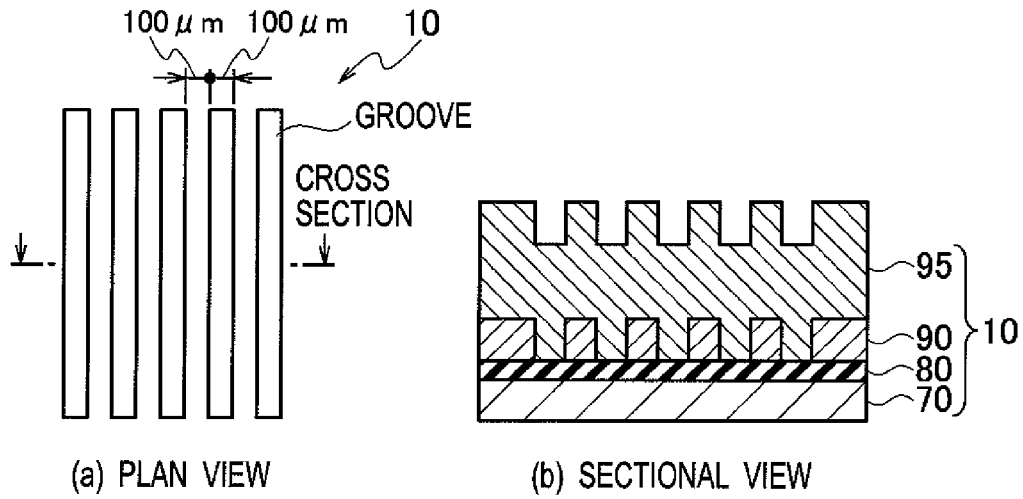
FIG. 1a and FIG. 1b are each a schematic view of a planarity-evaluating pattern.

The CMP slurry of the invention for silicon film polishing comprises abrasive grains, an oxidizing agent, a cationic surfactant, and water. About the CMP slurry of the invention for silicon film polishing, a silicon film, such as a polysilicon film or an amorphous silicon film, is used as a film to be polished, which will be described later.

<1> CMP Slurry for Silicon Film Polishing
<Abrasive Grains>

The abrasive grains used in the invention are not particularly limited as far as the grains are abrasive grains that are dispersible in water and have small change in the average particle diameter between times before and after the slurry is prepared. Examples thereof include ceria, silica, alumina, and zirconia. These may be used alone or in combination of two or more thereof. Of these examples, silica is preferred from the viewpoint of costs. For example, fumed silica, colloidal silica or some other silica is preferred. Of these silicas, colloidal silica is more preferred from the viewpoint of a decrease in scratches in a surface polished.

Colloidal silica may be obtained by a known production process based on the hydrolysis of a silicon alkoxide or the ion exchange of sodium silicate. The production process based on the hydrolysis of a silicon alkoxide is most widely used from the viewpoint of particle diameter controlling performance and alkali metal impurities. As the silicon alkoxide, TEMS (tetramethoxysilane) or TEOS (tetraethoxysilane) is generally used. In the process of the hydrolysis in an alcohol solvent, examples of the parameter that produces an effect on the particle diameter include the concentration of the silicon alkoxide, the concentration and the pH of ammonia used as a catalyst, the reaction temperature, the kind (molecular weight) of the alcohol solvent, and the reaction time. The adjustment of these parameters makes it possible to give a colloidal silica dispersed liquid having a desired particle diameter and aggregation degree.

When the variation in the average particle diameter of the abrasive grains is large between times before and after the preparation of the CMP slurry for silicon film polishing, the remaining film thickness of a polysilicon and the planarity of a polished surface are varied so that a desired result may not be obtained. Thus, the variation in the average particle diameter between the times before and after the preparation of the CMP slurry is preferably from 0 to 30 nm, more preferably from 0 to 20 nm. It is preferred to use, as the abrasive grains, colloidal silica since the abrasive grains do not sediment easily, so as not to need to be again dispersed.

The average particle diameter of the abrasive grains in the CMP slurry for silicon film polishing is preferably from 1 to 200 nm, more preferably from 5 to 100 nm from the viewpoint of the polishing rate, and scratches. The average particle diameter of the abrasive grains referred to herein is that after the CMP slurry for silicon film polishing is prepared. The wording "after the CMP slurry for silicon film polishing is prepared" denotes a time after about 24 hours elapse from the preparation of the CMP slurry. As the average particle diameter of the abrasive grains becomes smaller, the polishing rate of a silicon film tends to become lower so that a necessary polishing rate is less easily obtained. Thus, the average particle diameter of the abrasive grains is preferably 1 nm or more, more preferably 5 nm or more, even more preferably 10 nm or more, and in particular preferably 15 nm or more. As the average particle diameter of the abrasive grains becomes larger, the number of polish scratches in a polished surface tends to increase so as to result in a fall in the yield of semiconductor elements and in the reliability thereof. Thus, the average particle diameter of the abrasive grains is preferably 200 nm or less, more preferably 100 nm or less, even more preferably 75 nm or less, and in particular preferably 50 nm or less. As described above, in order to decrease polish scratches in a polished surface, it is desired to use abrasive grains having a small average particle diameter, for example, colloidal silica is very good also from the viewpoint that abrasive grains thereof which have an average particle diameter of 100 nm or less are inexpensive and are available. By modifying the surface of colloidal silica, abrasive grains having a zeta potential made lower than usual can be used. Such abrasive grains make polishing possible at a small concentration thereof. Thus, costs for the slurry can be decreased.

The average particle diameter of the abrasive grains may be measured with a particle size distribution meter of a dynamic light scattering type. Specifically, the average particle diameter may be measured with a Submicron Particle Analyzer N5 manufactured by Beckman Coulter Inc., or the like.

The concentration of the abrasive grains relative to 100 parts by mass of the CMP slurry for silicon film polishing is preferably from 0.1 to 10 parts by mass, more preferably from 0.2 to 8 parts by mass, and in particular preferably from 0.3 to 6 parts by mass from the viewpoint of the polishing rate, and economical efficiency. If the concentration of the abrasive grains is less than 0.1 parts by mass, the polishing rate tends to be declined. If the concentration is more than 10 parts by mass, economical efficiency may be damaged.

<Oxidizing Agent>

The oxidizing agent used in the invention is not particularly limited as far as the agent makes it possible to oxidize the surface of a silicon film. Specific examples thereof include hydrogen peroxide, peroxodisulfuric acid (persulfuric acid), peroxodisulphates (persulphates), ortho periodic acid, ortho periodates, and the like. Of these agents, hydrogen peroxide is preferred since the substance is ease to handle, and is good in stability after the preparation of the CMP slurry for silicon film polishing. Hydrogen peroxide is very good also in the point that an addition thereof causes a small pH change and thus when changing the addition amount thereof, no pH adjustment is required. When the substrate to be polished is a silicon substrate containing elements for an integrated circuit, it is undesired that the silicon substrate is contaminated with an alkali metal, an alkaline earth metal or a transition metal; thus, the oxidizing agent is desirably an oxidizing agent that does not contain these metals. However, when the substrate to which the slurry is applied is a glass substrate containing no semiconductor element, or the like, the oxidizing agent may be an oxidizing agent containing these metals. About the oxidizing agent, a single species thereof may be used, or two or more species thereof may be used in a mixture form.

About the CMP slurry of the invention for silicon film polishing, it appears that the surface of a silicon film is oxidized with the oxidizing agent so as to be turned to a silicon oxide film, thereby giving a good performance of canceling steps in the polished surface. Details thereof are as follows: A silicon film in concaves of a pattern is not easily polished; thus, the oxidation of the surface of the silicon film is advanced with the oxidizing agent, so that a silicon oxide film, which is small in polishing rate, is easily formed. On the other hand, the silicon film in convexes of the pattern is easily polished; thus, the convexes are polished largely than oxidized therein so that a silicon oxide film is less easily formed.

Accordingly, in a case where the oxidizing agent is added, the difference in the polishing rate between the concaves of the pattern and the convexes thereof in the silicon film would become larger than in a case where no oxidizing agent is added; as a result, the steps in the polished surface would be easily cancelled.

When the blend amount of the oxidizing agent in the CMP slurry for silicon film polishing is made large in the invention, an automatically-stopped property of polishing is obtained after steps of a polished surface are cancelled, the polishing rate is lowered. Thus, the polishing can be stopped with a good reproducibility so that the remaining film thickness can be controlled. For example, in the step of forming floating gates of flash memories, by adjusting the blend amount of the oxidizing agent, the polishing can be automatically stopped after convexes of portions of a silicon film that are over the element isolation insulating film, which is an underlay of the silicon film, are removed so that the irregularities (the convexes and the concaves) are cancelled, and before the element isolation insulating film is made uncovered. In conventional CMP slurries, such an automatically-stopped property of polishing is not exhibited, so that the remaining film thickness is not easily controlled and the planarity of the polished surface is not sufficient, either.

On the other hand, as the blend amount of the oxidizing agent is smaller, the formation of a silicon oxide film, which is not easily polished, is less caused. Thus, the polishing of the silicon film advances so that the remaining film thickness is made smaller. When the blend amount of the oxidizing agent is even smaller, the silicon film is polished until underlays such as a gate structure, an inter-gate insulating film, and an element isolation insulating film, are made uncovered. When the workpiece is next over-polished, unnecessary portions of the silicon film are removed so that a good planarity of the polished surface is obtained. Examples of the underlays of the silicon film include: oxide films such as an element isolation insulating film and an inter-gate insulating film; and nitride films such as a gate capped layer. The polishing rate of these films is sufficiently smaller than that of the silicon film, so that the selection ratio is large; therefore, the polish amount of the underlays of the silicon film by over-polishing is also small. For example, in the formation of contact plugs of DRAMs, it is preferred that in the CMP of a silicon film, which is an electroconductive material for the contact plugs, the addition amount of the oxidizing agent is adjusted so as to advance the polishing until the underlay is made uncovered. It is necessary to perform over-polishing for removing unnecessary portions of the silicon film completely; however, on the surface of the silicon film in concave of contact hole regions, an oxide film is formed by effect of the oxidizing agent so that the polishing rate thereof is lowered. Thus, the generation of dishing or erosion is restrained. As a result, a good planarity of the polished surface can be obtained. According to any conventional CMP slurry, a silicon film in concave of contact hole regions is excessively polished so that erosion or dishing advances. Thus, the planarity of the polished surface cannot be obtained.

From a viewpoint as descried above, the content of the oxidizing agent is preferably from 0.1 to 20 parts by mass relative to 100 parts by mass of the CMP slurry for silicon film polishing. When the content of the oxidizing agent is 0.1 part or more by mass, the planarity of the polished surface after the polishing tends to become good. From this viewpoint, the content is more preferably 0.3 part or more by mass, in particular preferably 0.6 part or more by mass. When the content of the oxidizing agent is 20 parts or less by mass, an excessive decline in the polishing rate of the silicon film is easily prevented. From this viewpoint, the content is more preferably 15.0 parts or less by mass, in particular preferably 10.0 parts or less by mass. Hydrogen oxide, which is preferable as the oxidizing agent, is commercially available usually as an aqueous solution (hydrogen peroxide water) wherein the concentration of hydrogen peroxide water is 30% or less by mass. The amount of hydrogen peroxide water added into slurry is calculated based on the amount of hydrogen peroxide itself to give a content within the above-mentioned range.

In the invention, it is preferred to adjust the content of the oxidizing agent appropriately in accordance with a target polishing characteristic. Specifically, in CMP aiming to control the remaining film thickness of a silicon film and to stop the polishing automatically as in a case where in the step of forming floating gates of flash memories the polishing of a silicon film is automatically stopped before the element isolation insulating film is made uncovered, the content of the oxidizing agent is preferably from 0.3 to 20.0 parts by mass, more preferably from 0.6 to 15.0 parts by mass, and in particular preferably from 0.9 to 10.0 parts by mass relative to 100 parts by mass of the CMP slurry for silicon film polishing.

In CMP aiming for a good planarity of a silicon film in concave regions as in the polishing of a silicon film in the formation of contact plugs of DRAMs, the content of the oxidizing agent is preferably from 0.1 to 5.0 parts by mass, more preferably from 0.1 to 4.0 parts by mass, and in particular preferably from 0.1 to 3.0 parts by mass relative to 100 parts by mass of the CMP slurry for silicon film polishing. The invention can cope with a desired polishing characteristic by adjusting appropriately the composition of the slurry for silicon film polishing, the film quality of a film to be polished, and polishing conditions besides selecting the content of the oxidizing agent appropriately as described above.

When the content of the oxidizing agent is from 0.3 to 5.0 parts by mass relative to 100 parts by mass of the CMP slurry for silicon film polishing, both polishing conditions can be provided, one is polishing until the underlay is made uncovered, and the other is polishing until the polishing is automatically stopped. Within this content range, by adding a dopant into a silicon film as a film to be polished, decreasing the polishing pressure, or decreasing the concentration of the abrasive grains in the slurry for silicon film polishing, polishing is automatically stopped before the underlay is made uncovered even if the content of the oxidizing agent is not varied. Thus, the remaining film thickness of the silicon film is easily controlled. On the other hand, by restraining the addition of a dopant into the silicon film as a film to be polished, increasing the polishing pressure, or increasing the concentration of the abrasive grains in the slurry for silicon film polishing, a good planarity is easily obtained.

When the composition is not varied except the content of the oxidizing agent in the slurry for silicon film polishing, the film quality of a film to be polished is not varied and polishing conditions are not varied, the automatic stop is more easily attained in the content range of the oxidizing agent of 0.3 to 5.0 parts by mass relative to 100 parts by mass of the CMP slurry for silicon film polishing as the content of the oxidizing agent is larger.

In the invention, the oxidizing agent may be added together with the other components when the CMP slurry for silicon film polishing is produced. Preferably, in order that the content of the oxidizing agent can be adjusted in accordance with a target polishing characteristic, the oxidizing agent is mixed with the components other than the oxidizing agent, which will be called the "slurry before the addition of the oxidizing agent" hereinafter, when the CMP slurry for silicon film polishing is used. Also from the viewpoint of the storage stability of the CMP slurry for silicon film polishing, it is preferred that the oxidizing agent is mixed when the slurry is used. In the case of adding an aqueous solution as the oxidizing agent, such as hydrogen peroxide water, the abrasive grains and the cationic surfactant are diluted; thus, it is necessary to set the concentrations of the abrasive grains and the cationic surfactant in the slurry before the addition of the oxidizing agent to higher values than the concentrations when the CMP slurry is used. If the addition of the oxidizing agent causes a fall in the concentrations of the abrasive grains and the cationic surfactant at the time of the use, a fall in the polishing rate or a deterioration in the planarity is easily caused. Thus, the concentration of the abrasive grains and that of the cationic surfactant in the slurry before the addition of the oxidizing agent are each preferably 1.1 times or more, more preferably 1.5 times or more, and in particular preferably 2 times or more the concentration thereof at the time of the use. As the concentrations of the abrasive grains and the cationic surfactant in the slurry before the addition of the oxidizing agent is higher, the addition amount of the oxidizing agent is increased with a higher possibility. As a result, the range that the addition amount of the oxidizing agent is adjustable becomes wider. Moreover, costs for the slurry are also decreased. Thus, it is more preferred that the concentrations are higher. However, if the concentrations are each higher than 20 times, the storage stability of the slurry before the addition of the oxidizing agent deteriorates. Thus, when the slurry is used as a CMP slurry for silicon film polishing, the planarity of a surface polished therewith may deteriorate. Therefore, the concentrations are each preferably 20 times or less, more preferably 15 times or less, and in particular preferably 10 times or less.

When the film thickness of a silicon film to be polished is considerably larger than the initial step difference (the difference in film thickness between concaves and convexes of the silicon film), for example, when the film thickness of a silicon film to be polished is more than 2 times the initial step difference, it is preferred to use the CMP slurries, for silicon film polishing, having different oxidizing agent contents to polish the silicon film at two separated stages. Specifically, first, by use of the CMP slurry for silicon film polishing wherein the oxidizing agent content is less than 0.1 part by mass relative to 100 parts by mass of the CMP slurry, the silicon film is polished until the remaining film thickness of the silicon film becomes 0.5 to 1.5 times the initial step difference. Subsequently, by use of the CMP slurry for silicon film polishing wherein the oxidizing agent content is from 0.1 to 20 parts by mass relative to 100 parts by mass of the CMP slurry, the silicon film is polished, thereby making it possible to shorten the polishing period while the planarity is maintained. This method may be used whether the underlay of the silicon film is made uncovered or not. This two-stage polishing, using CMP slurries for silicon film polishing of the invention, is very useful for a case where the polishing is applied to the CMP of a semiconductor element wherein the film thickness of a silicon film to be polished is large since an improvement in throughput is made, so that the polishing can be effectively attained.

<Cationic Surfactant>

The cationic surfactant used in the invention may be a cationic surfactant having water-solubility. Examples thereof include aliphatic amines or salts thereof, alkylamideamine salts $(R_1CONH(CH_2)_nN(R_2)(R_3).X)$, monoalkyltrimethylammonium salts $(R(CH_3)_3N.X)$, dialkyldimethylammonium salts $((R)_2N(CH_3)_2.X)$, alkylbenzyldimethylammonium salts $((R(CH_2Ph)(CH_3)_2N.X)$, alkyl pyridinium salts (PyR.X), chlorinated benzethonium salts $(R.PhO(CH_2)_2O(CH_2)N(CH_3)_2CH_2Ph.X)$, and other quaternary ammonium salt type-cationic surfactants. Of these surfactants, monoalkyltrimethylammonium salts are preferred.

The following may be used besides: an aliphatic diamine having at each terminal of its alkyl chain which is a hydrophobic group, a cationic hydrophilic group, or a salt thereof; a methonium dihydroxide or a salt thereof $(N(CH_3)_3X)C_nH_{2n}(N(CH_3)_3X)$; or the like. Such a surfactant having at each of its terminals a cationic hydrophilic group, is equivalent in polishing characteristics to surfactants each having at its single terminal a cationic hydrophilic group, but is better than the surfactants having at its single terminal a cationic hydrophilic group in the point that foaming is not given to slurry. These cationic surfactants may be used alone or in combination of two or more thereof.

About the R moiety/moieties of the monoalkyltrimethylammonium salts $(R(CH_3)_3N.X)$, dialkyldimethylammonium salts $((R)_2N(CH_3)_2.X)$, alkylbenzyldimethylammonium salts $((R(CH_2Ph)(CH_3)_2N.X)$, alkylpyridinium salts (PyR.X), chlorinated benzethonium salts $(R.PhO(CH_2)_2O(CH_2)N(CH_3)_2CH_2Ph.X)$ and the like, and the $C_nH_{2n}$ moiety of the methonium dihydroxide or the salt thereof $(N(CH_3)_3X)C_nH_{2n}(N(CH_3)_3X)$, it is preferred that the moiety is preferably an alkyl or alkylene group having 8 to 18 carbon atoms from the viewpoint of the polishing rate and the storage stability of the slurry. As the number of the carbon atoms is larger, the polishing rate of a silicon film tends to be larger. Thus, the number is preferably 8 or more, more preferably 10 or more. If the number of the carbon atoms increases excessively, the abrasive grains may aggregate easily so that the storage stability tends to deteriorate. Thus, the number is preferably 18 or less, more preferably 16 or less, and in particular preferably 14 or less. About $R_1$, $R_2$ and $R_3$ in the alkylamideamine salts $(R_1CONH(CH_2)_nN(R_2)(R_3).X)$, $R_1$ is preferably an alkyl group having 8 to 18 carbon atoms, and $R_2$ and $R_3$ are each preferably an alkyl group having 1 to 4 carbon atoms. In the above-mentioned formulae, each of Xs is not particularly limited as far as X turns into a minus ion. Examples thereof include Cl, Br, I, $NO_3$, $CH_3COO$, and OH, which are each a minus ion.

Specific examples of the cationic surfactant include aliphatic amines such as octylamine, decylamine, dodecylamine, tetradecylamine, hexadecylamine, methyldodecylamine, and dimethyldodecylamine; monoalkyltrimethyl ammonium salts such as octyltrimethylammonium bromide, decyltrimethylammonium bromide, lauryltrimethylammonium chloride, myristyltrimethylammonium chloride, cetyltrimethylammonium chloride, and stearyltrimethylammonium bromide; aliphatic diamines such as 1,8-diaminooctane, 1,10-diaminodecane, 1,12-diaminododecane, 1,14-diaminotetradecane, and 1,16-diaminohexadecane; methonium dihydroxide salts such as octamethonium chloride, decamethoniium bromide, dodecamethonium bromide, tetradecamethonium chloride, and hexadecamethonium chloride.

The content of the cationic surfactant is preferably from 0.0001 to 0.1 part by mass, more preferably from 0.0005 to 0.05 part by mass relative to 100 parts by mass of the CMP slurry for silicon film polishing. If the content of the cationic surfactant is less than 0.0001 part by mass, the polishing rate of a silicon film is low so that a sufficient polishing rate is not obtained. Thus, the content is preferably 0.0001 part or more by mass, more preferably 0.0005 part or more by mass, and in particular preferably 0.001 part or more by mass. If the content of the cationic surfactant is more than 0.1 part by mass, the abrasive grains may aggregate so that the storage stability of the slurry deteriorates. Thus, the content is preferably 0.1 part or less by mass, more preferably 0.05 part or Less by mass, and in particular preferably 0.025 part or less by mass.

<Other Components of the CMP Slurry for Silicon Film Polishing>

It is preferred to adjust the pH of the CMP slurry of the invention for silicon film polishing appropriately in the range of 4 to 10 from the viewpoint of the dispersibility of the abrasive grains. If the pH is less than 4, the polishing rate of a silicon oxide film may increase so that the automatically-stopped property of polishing is not easily obtained. Thus, the pH is preferably 4 or more, more preferably 5 or more, and in particular preferably 5.5 or more. If the pH is more than 10, the slurry may become difficult to handle. Thus, the pH is preferably 10 or less, more preferably 9 or less, and in particular preferably 8 or less. When hydrogen peroxide is used as the oxidizing agent, hydrogen peroxide may be unstable in an alkaline slurry. Thus, the pH is preferably set to 9 or less. The pH in the invention may be measured by use of a pH meter (trade name: "HM-21P", manufactured by DKK-TOA Corp.).

The method for adjusting the pH into a desired value is, for example, a method of adding an acid or an alkali appropriately. The acid is not particularly limited, and may be: an inorganic acid such as hydrochloric acid, nitric acid or sulfuric acid; or an organic acid such as oxalic acid, acetic acid, or malic acid. The alkali is not particularly limited, and may be ammonia, an amine, a quaternary ammonium hydroxide, potassium hydroxide, or the like.

The blend amount of water in the CMP slurry for silicon film polishing may be the balance, and is not particularly limited as far as water is contained in the CMP slurry for silicon film polishing.

<2> Polishing Method, Using the CMP Slurry for Silicon Film Polishing

The CMP slurry for silicon film of the invention, as described above, may be used in the CMP of a silicon film such as a polysilicon film or an amorphous silicon film.

A polishing method using the CMP slurry for silicon film polishing of the invention may be carried out, using a commercially available CMP apparatus. A substrate on which a silicon film is formed as a film to be polished is pushed and pressed onto a polishing pad of a polishing table. While the CMP slurry for silicon film polishing is dropped down onto the polishing pad, the polishing table and the substrate, on which the film to be polished is formed, are rotated into the same direction, thereby carrying out CMP. In the case of adding the oxidizing agent when the slurry is used, it is allowable to: mix the oxidizing agent and the slurry before the addition of the oxidizing agent beforehand in a tank of a supplying device and then drop down the resultant liquid onto the polishing pad; supply an aqueous solution of the oxidizing agent and the slurry before the addition of the oxidizing agent through different supplying lines to drop down the solution and the slurry independently of each other onto the polishing pad; or mix the oxidizing agent and the slurry before the addition of the oxidizing agent with each other in a pipe just before these are dropped down onto the polishing pad, so as to supply the mixture.

Conditions for the polishing are not particularly limited. The rotating speed of the table is preferably as low as 200 rpm or less so as for the substrate not to spin out. The pushing pressure of the substrate, which has the surface to be polished, onto the polishing cloth is preferably from 1 to 100 kPa. In order that the evenness of the polishing speed in the surface to be polished and the planarity of the pattern may be satisfied, the pressure is preferably from 5 to 50 kPa. During the polishing, the CMP slurry for silicon film polishing of the invention is continuously supplied onto the polishing pad through a pump or the like. The amount of the supply is not particularly limited, and is preferably such an amount that the surface of the polishing pad is constantly covered with the polishing slurry.

For the decision of the end point of the polishing, an end point detecting method, such as an optical method or a torque measuring method, may be used. The end point detecting method may be used for a case of whether the underlay formed below the silicon film is made uncovered or not. The time when a change in the signal intensity of the end point detector comes not to be observed so that the intensity turns into a constant value is the end of the polishing. Thereafter, an appropriate over-polishing is performed, thereby completing the polishing. When the polishing apparatus does not have an end-point-detecting function, the polishing may be performed under a condition that a predetermined polishing period is set. The CMP slurry for silicon film polishing of the invention is high in anti-over-polishing performance so as to give a polishing period large in margin. Thus, when semiconductor elements having the same structure are polished, the CMP slurry may be used in the production thereof even when the detection of the end point is not utilized.

After the end of the polishing, it is preferred to wash the substrate sufficiently with flowing water, use a spin drier or the like to wipe off water droplets adhering onto the substrate, and then dry the substrate.

The polishing method for the substrate of the invention is characterized in comprising the steps of:

pushing and pressing a substrate having a silicon film as a film to be polished against a polishing cloth of a polishing table, the film to be polished being formed on the substrate; and polishing the film to be polished by moving the substrate having the silicon film as the film to be polished and the polishing table, while supplying a CMP slurry for silicon film polishing of the invention between the film to be polished and the polishing cloth.

The polishing method for the substrate of the invention is also a polishing method characterized in that the substrate comprises: an underlay having a surface comprising concaves and convexes; and a silicon film covering the underlay along its surface, and characterized in comprising the step of polishing the silicon film to make the convexes of the underlay uncovered, wherein a CMP slurry for silicon film polishing of the invention is used to perform the polishing. In this polishing method, the content of the oxidizing agent is preferably from 0.1 to 5.0 parts by mass, more preferably from 0.1 to 4.0 parts by mass in 100 parts by mass of the CMP slurry for silicon film polishing.

The polishing method for the substrate of the invention is also a polishing method characterized in that the substrate comprises: an underlay comprising concaves and convexes; and a silicon film formed on the underlay, and characterized in comprising the steps of: polishing the silicon film; and stopping the polishing before the underlay is made uncovered, wherein a CMP slurry for silicon film polishing of the invention is used to perform the polishing. In the polishing method, the content of the oxidizing agent is preferably from 0.3 to 20.0 parts by mass, more preferably from 0.6 to 15.0 parts by mass in 100 parts by mass of the CMP slurry for silicon film polishing.

The polishing method of the invention is also a polishing method for a silicon film of a substrate, wherein the substrate has concaves and convexes, and has the silicon film, the film thickness thereof to be polished being a film thickness more than the double of an initial step difference between the concaves and the convexes, comprising the steps of: a first step of polishing the silicon film until the remaining film thickness of the silicon film becomes from 0.5 to 1.5 times the initial step difference by using a CMP slurry for silicon film polishing of the invention wherein the content of the oxidizing agent is low; and a second step of polishing the silicon film by using a CMP slurry for silicon film polishing of the invention wherein the content of the oxidizing agent is high. In this polishing method, the content of the oxidizing agent is preferably less than 0.1 part by mass, more preferably less than 0.05 part by mass relative to 100 parts by mass of the CMP slurry, for silicon film polishing, used in the first step. The content of the oxidizing agent is preferably from 0.1 to 20.0 parts by mass, more preferably from 0.5 to 15.0 parts by mass relative to 100 parts by mass of the CMP slurry, for silicon film polishing, used in the second step.

EXAMPLES

Examples of the invention will be described hereinafter. The invention is not limited by these examples.

Examples 1 to 9

Production of CMP Slurries (I) to (IX) for Silicon Polishing

Individual components shown in Table 1 were mixed with each other to produce each of CMP slurries (I) to (IX) for silicon polishing that each had a pH of 6.7.

The pH was measured with a pH meter (model number: HM-21P, manufactured by DKK-TOA Corp.). A standard buffer solution (phthalate pH buffer solution 4.01 in pH (at 25° C.), a neutral phosphate pH buffer solution 6.86 in pH (at 25° C.), and a borate standard solution 9.18 in pH (at 25° C.)) was used to make a three-point correction, and then electrodes were put into each of the CMP slurries for silicon polishing. Ten minutes or more elapsed to make the pH stable. Thereafter, the stable value thereof was measured.

In each of Examples 1 to 5, the concentration of hydrogen peroxide relative to 100 parts by mass of the CMP slurry for silicon film polishing was 0.9 part by mass; in Example 6, that was 1.2 parts by mass; in Example 7, that was 1.8 parts by mass; and in Examples 8 and 9, that was 1.5 parts by mass. In Examples 1 to 4, and Examples 6 to 8, the concentration of the cationic surfactant was 0.005 part by mass; and in Example 5 and 9, that was 0.002 part by mass. In all of these examples, the concentration of the abrasive grains was 4.0 parts by mass.

About the colloidal silica (A) used in the CMP slurries (I) to (IX) for silicon polishing, the zeta potential at a pH of 7 was −25 mV. The average particle diameter of secondary particles of the colloidal silica was about 15 nm before the production of each of the CMP slurries for silicon polishing, and was from about 15 to 30 nm just after the production. Also after the slurry was allowed to stand still at room temperature for one month after the production, the average particle diameter thereof was from about 15 to 30 nm, which was hardly changed.

<Evaluations of the CMP Slurries (I) to (IX) for Silicon Polishing>

While the CMP slurries (I) to (IX) for silicon film polishing, which were produced in Examples 1 to 9, respectively, were each dropped down onto a polishing pad caused to adhere onto a table, a patterned substrate 10 having a cross section illustrated in FIG. 1(b) was polished. As the patterned substrate 10, a substrate produced as described below was used. First, a SiN film 80 was formed into a thickness of 20 nm onto a Si substrate 70 having a diameter of 8 inches. A SiO film 90 was formed into a thickness of 100 nm thereon. Next, a photoresist pattern was used as a mask to etch the SiO film 90 to make grooves. At this time, the SiN film 80 functioned as an etching stopper film. At last, the photoresist pattern was removed, and then CVD (chemical vapor deposition) was utilized to form a polysilicon film 95 into a thickness of 200 nm thereon.

FIG. 1(a) illustrates a plan view of the patterned substrate 10. The pattern was a line and space pattern wherein the grooves and spaces were each 100 µm in width. The step difference was 100 nm in height.

Figure 2:
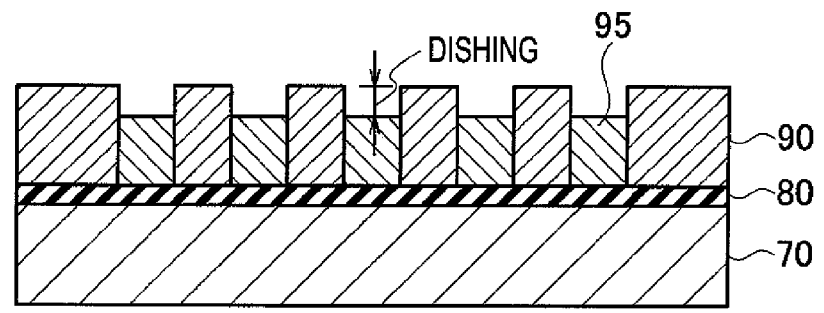
FIG. 2a and FIG. 2b are each a section structural view of the evaluating pattern after CMP.
Figure 2:
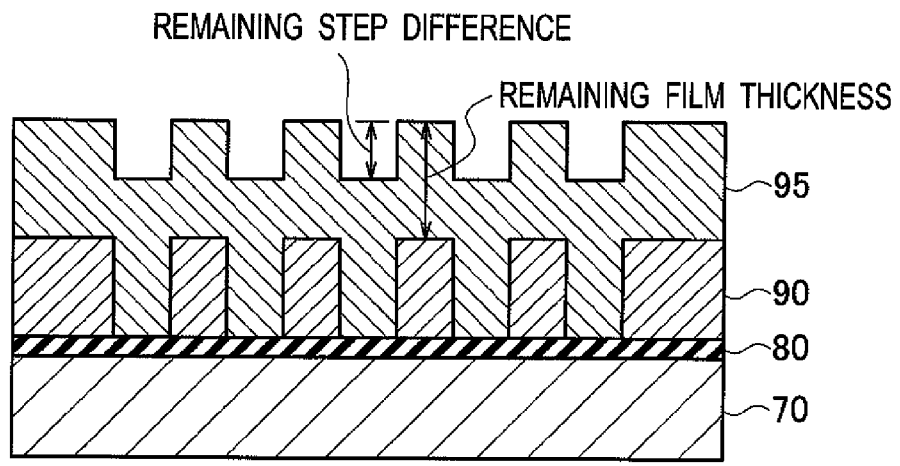

In FIG. 2 are each illustrated a cross section of the substrate after it was polished. FIG. 2(a) illustrates a state that the polysilicon film 95 was polished until the SiO film 90 as an underlay was made uncovered, and FIG. 2(b) illustrates a state that the polishing of the polysilicon film 95 was automatically stopped before the underlay SiO film 90 was made uncovered.

Figure 3:
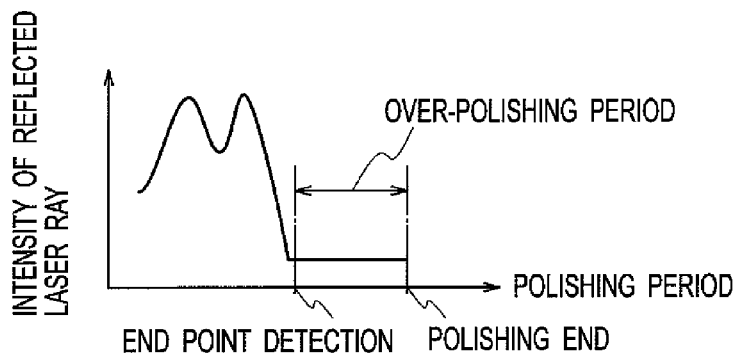
FIG. 3a and FIG. 3b are each a schematic chart of a waveform through an optical end-point detector.
Figure 3:
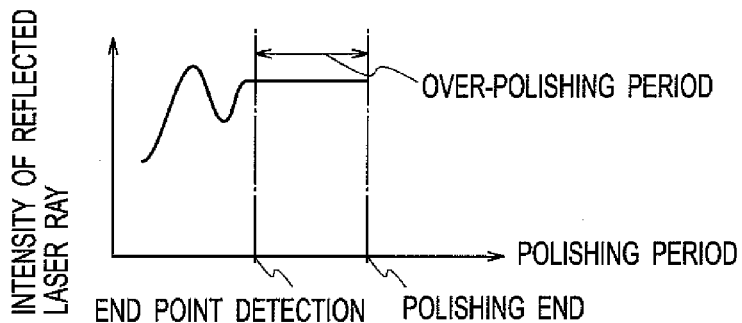

Conditions used for the polishing were described below. For the decision of the end point of the polishing, an optical end point detecting method was used. The optical end point detecting method is a method of radiating a laser ray from the table side through a window made in the polishing pad to a surface of a wafer, and then detecting the end point of the polishing through a change in the intensity of the reflected ray. In FIG. 3 are schematically shown waveforms for the detection of the end point. FIG. 3(a) shows the waveform when the polysilicon film 95 was polished until the SiO film 90 as the underlay was made uncovered, and FIG. 3(b) shows the waveform when the polishing of the polysilicon film 95 was automatically stopped before the SiO film 90 as the underlay was made uncovered. When the polishing advances so that the film thickness is changed, the intensity of the reelected laser ray is changed; however, when the SiO film 90 as the underlay is made uncovered or when the polishing of the polysilicon film 95 is automatically stopped, the intensity of the reelected laser ray turns constant. In the present examples, the period after 5 seconds from the time when the intensity of the reflected laser ray turned substantially constant was defined as the end point detection period. Thereafter, over-polishing was performed for 30 seconds.

(Polishing Conditions)

Polishing apparatus: a rotary type apparatus (Mirra, manufactured by Applied Materials Inc.)

Polishing pads: polishing pads made of foamed polyurethane resin

Pad groove: concentric circles

Polishing pressure: 140 hPa

Rotating number of the wafer substrate: 90 rotations/minute

Rotating number of the polishing table: 90 rotations/minute

Flow rate of each of the slurries: 200 mL/minute

Polishing period: after the end point was detected by the optical end point detecting method, over-polishing was performed for 30 seconds.

The evaluation results are shown in Tables 1 and 2.

When the polysilicon film 95 was polished until the SiO film 90 as the underlay was made uncovered, the dishing amount, shown in FIG. 2(a), was measured. When the polishing of the polysilicon film 95 was automatically stopped before the SiO film 90 as the underlay was made uncovered, the remaining step difference and the remaining film thickness, shown in FIG. 2(b), were measured. For the measurements of the dishing amount and the remaining step difference, a stylus profilometer was used; and for the measurement of the remaining film thickness, an optical interference type film thickness meter was used. About the dishing amount, the dishing amounts of 5 points in the surface of the wafer were measured and then the average thereof was calculated. About the measurement of the remaining film thickness, the remaining film thicknesses of 9 points in the wafer surface were measured and then the average thereof was calculated. It is preferred that the dishing amount or the remaining step difference is 50 nm or less, which is not more than the half of the initial step difference.

TABLE 1

| | | | | Examples | | | | |
|---|---|---|---|---|---|---|---|---|
| | | | | 1 | 2 | 3 | 4 | 5 |
| | CMP slurry for silicon film polishing | | | (I) | (II) | (III) | (IV) | (V) |
| Composition of components (parts by mass) in the CMP slurry for silicon film polishing | Abrasive grains | Colloidal silica (A) | | 4.0 | 4.0 | 4.0 | 4.0 | 4.0 |
| | Oxidizing agent | Hydrogen peroxide | | 0.9 | 0.9 | 0.9 | 0.9 | 0.9 |
| | Cationic surfactant | Octyltrimethylammonium chloride | | 0.005 | 0 | 0 | 0 | 0 |
| | | Dodecyltrimethylammonium chloride | | 0 | 0.005 | 0 | 0 | 0 |
| | | Hexadecyltrimethylammonium chloride | | 0 | 0 | 0.005 | 0 | 0 |
| | | Decylamine | | 0 | 0 | 0 | 0.005 | 0 |
| | | Decamethonium bromide | | 0 | 0 | 0 | 0 | 0.002 |
| | pH adjustor | Malic acid | | 0.005 | 0.005 | 0.005 | 0.005 | 0.005 |
| | Water | | | 95.09 | 95.09 | 95.09 | 95.09 | 95.093 |
| pH of the CMP slurry for silicon film polishing | | | | 6.7 | 6.7 | 6.7 | 6.7 | 6.7 |
| Characteristics | Dishing amount (nm) of the polysilicon film | | | 40 | 30 | 30 | 45 | 30 |
| | Remaining step difference (nm) of the polysilicon film | | | | | | | |
| | Remaining film thickness (nm) of the polysilicon film | | | | | | | |
| | End point detection period (seconds) | | | 90 | 80 | 75 | 95 | 75 |
| | Polishing rate (nm/minute) of the polysilicon film | | | 133 | 150 | 160 | 126 | 160 |
| | Polishing rate (nm/minute) of the SiO film | | | 1 | 1 | 1 | 1 | 1 |
| | Ratio of the Polishing rate of the polysilicon film to that of the SiO film | | | >100 | >100 | >100 | >100 | >100 |

TABLE 2

| | | | | Examples | | | |
|---|---|---|---|---|---|---|---|
| | | | | 6 | 7 | 8 | 9 |
| | CMP slurry for silicon film polishing | | | (VI) | (VII) | (VIII) | (IX) |
| Composition of components (parts by mass) in the CMP slurry for silicon film polishing | Abrasive grains | Colloidal silica (A) | | 4.0 | 4.0 | 4.0 | 4.0 |
| | Oxidizing agent | Hydrogen peroxide | | 1.2 | 1.8 | 1.5 | 1.5 |
| | Cationic surfactant | Octyltrimethylammonium chloride | | 0 | 0 | 0 | 0 |
| | | Dodecyltrimethylammonium chloride | | 0.005 | 0.005 | 0 | 0 |
| | | Hexadecyltrimethylammonium chloride | | 0 | 0 | 0 | 0 |
| | | Decylamine | | 0 | 0 | 0.005 | 0 |
| | | Decamethonium bromide | | 0 | 0 | 0 | 0.002 |
| | pH adjustor | Malic acid | | 0.005 | 0.005 | 0.005 | 0.005 |
| | Water | | | 94.79 | 94.19 | 94.49 | 94.493 |
| pH of the CMP slurry for silicon film polishing | | | | 6.7 | 6.7 | 6.7 | 6.7 |
| Characteristics | Dishing amount (nm) of the polysilicon film | | | | | | |
| | Remaining step difference (nm) of the polysilicon film | | | 40 | 50 | 50 | 40 |
| | Remaining film thickness (nm) of the polysilicon film | | | 80 | 120 | 70 | 100 |
| | End point detection period (seconds) | | | 65 | 55 | 70 | 50 |
| | Polishing rate (nm/minute) of the polysilicon film | | | 111 | 87 | 111 | 120 |
| | Polishing rate (nm/minute) of the SiO film | | | | | | |
| | Ratio of the Polishing rate of the polysilicon film to that of the SiO film | | | | | | |

According to Tables 1 and 2, in Examples 1 to 5, wherein the addition amount of hydrogen peroxide was 0.9 part by mass, the polishing of the polysilicon film 95 advanced until the SiO film 90 as the underlay was made uncovered. In each of these cases, by the over-polishing for 30 seconds, unnecessary portions of the polysilicon film 95 were completely removed, and the dishing amount was 45 nm or less. Thus, it appears that both of the step difference canceling performance and the over-polishing resistance were good. The polishing period was about 2 minutes per substrate. Thus, the polishing rate applicable to manufacture was obtained.

In Tables 1 and 2 is shown the polishing rate (nm/minute) calculated from the end point detection period. In Examples 1 to 5, the polishing rate was calculated out by dividing the initial film thickness (200 nm) of the polysilicon film 95 by the end pointed detection period; and in Examples 6 to 9, that was calculated out by dividing the difference between initial film thickness (200 nm) of the polysilicon film 95 and the remaining film thickness thereof by the end point detection period.

Separately, a wafer having no pattern wherein a SiO film was formed into a thickness of 100 nm on a Si substrate having a diameter (φ) of 8 inches was used, and the wafer was polished with each of the CMP slurries for silicon film polishing of Examples 1 to 5. The polishing rate of the SiO film was measured. As a result, about each of the slurries, the polishing rate of the SiO film was about 1 nm/minute. The ratio of the polishing rate of the polysilicon film to that of the SiO film was larger than 100. Thus, it was understood that the polishing selectivity of the polysilicon film was higher than that of the SiO film. Accordingly, it can be mentioned that the polish amount of the SiO film by the over-polishing was small.

In each of Examples 6 to 9, wherein the concentration of hydrogen peroxide in the CMP slurry for silicon film polishing was high, the polishing was automatically stopped when the remaining step difference of the polysilicon film 95 was about 50 nm. The automatic stop was understood from the waveform for the end point detection. About the CMP slurries for silicon film polishing of Examples 2, 6 and 7, which had the same composition except the concentrations of hydrogen peroxide and water, it is understood that the planarity of the polysilicon film and the remaining film thickness thereof were varied in accordance with the concentration of hydrogen peroxide.

Figure 4:
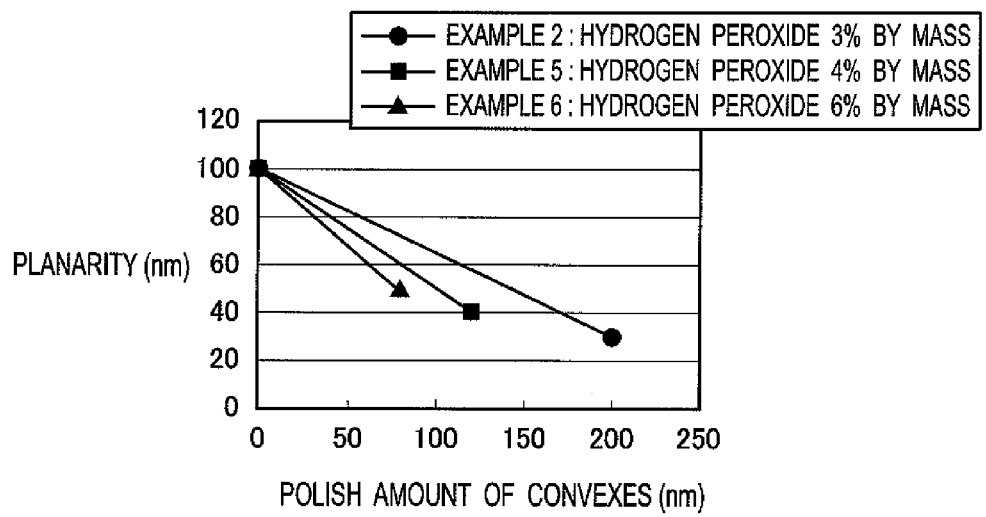
FIG. 4 is a graph showing relationships between the polish amount of convexes and planarity.
Figure 5:
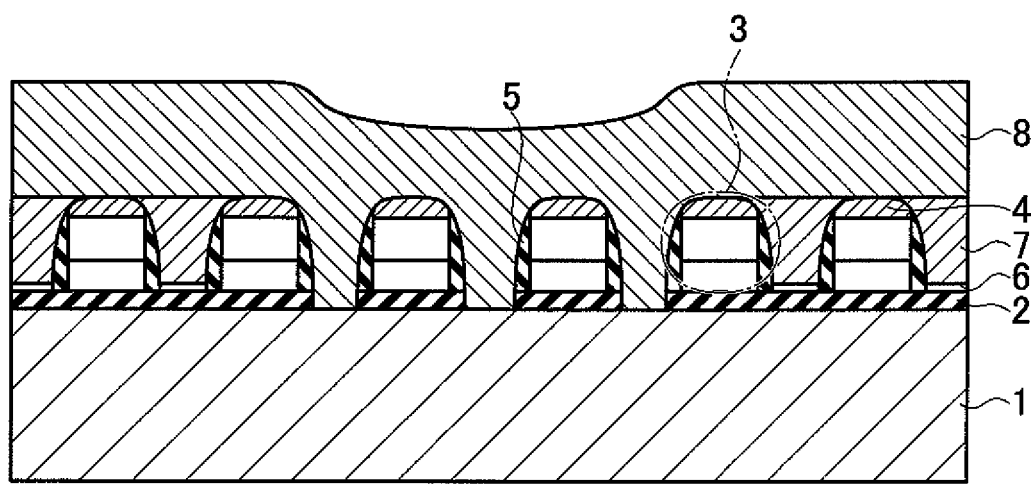
FIG. 5 is a sectional view of semiconductor elements before an electroconductive material for contact plugs of DRAMs is subjected to CMP.
Figure 6:
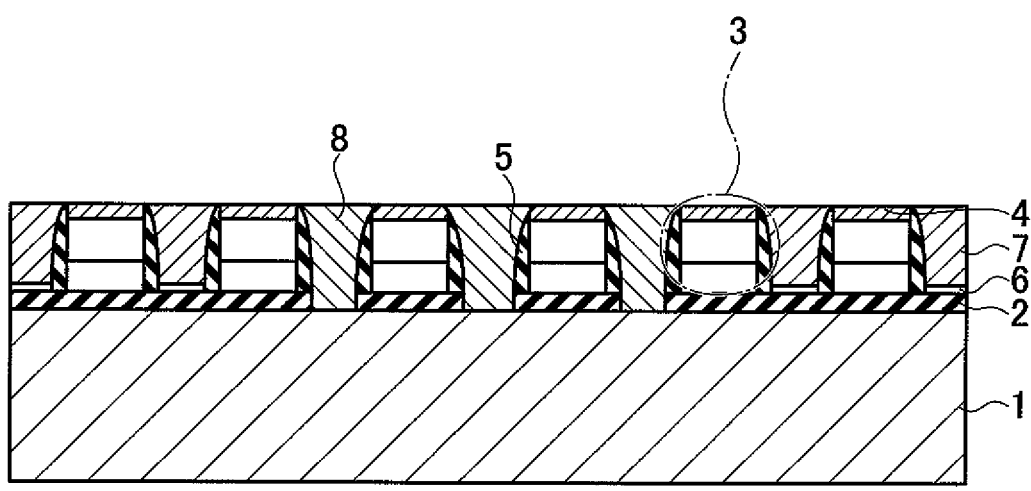
FIG. 6 is a sectional view of the semiconductor elements after the electroconductive material for the contact plugs of the DRAMs is subjected to the CMP.
Figure 7:
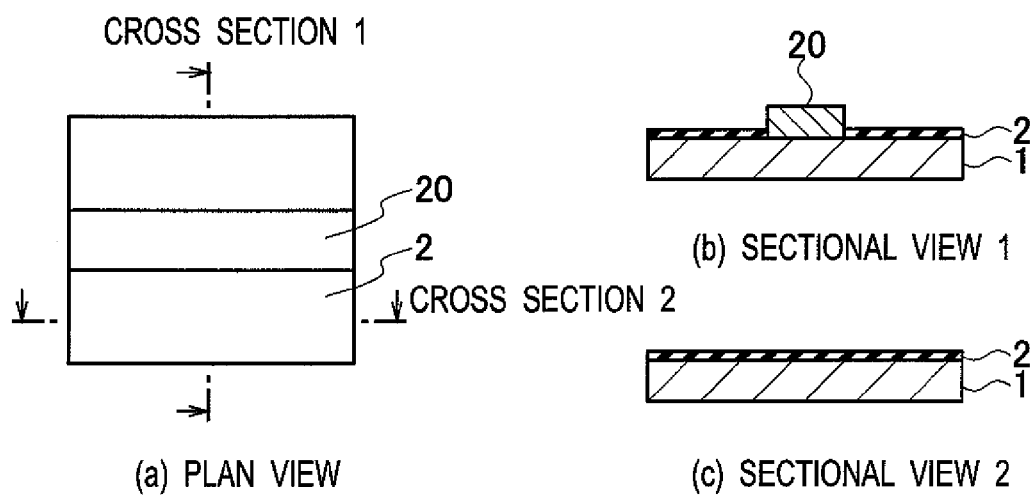
FIG. 7a, FIG. 7b and FIG. 7c are each a process chart of the formation of floating gates, using a CMP of a polysilicon film.
Figure 8:
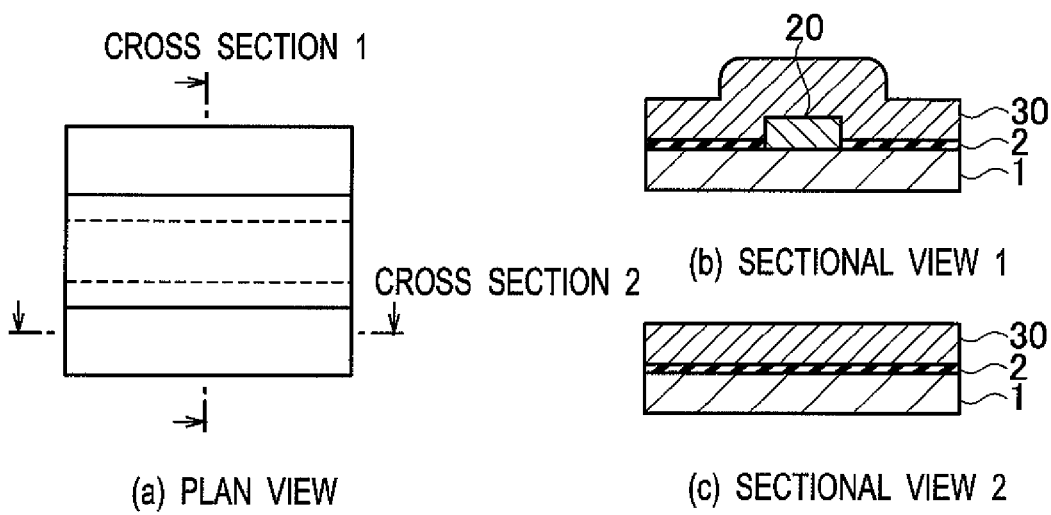
FIG. 8a, FIG. 8b and FIG. 8c are each a process chart of the formation of the floating gates, using the CMP of the polysilicon film.
Figure 9:
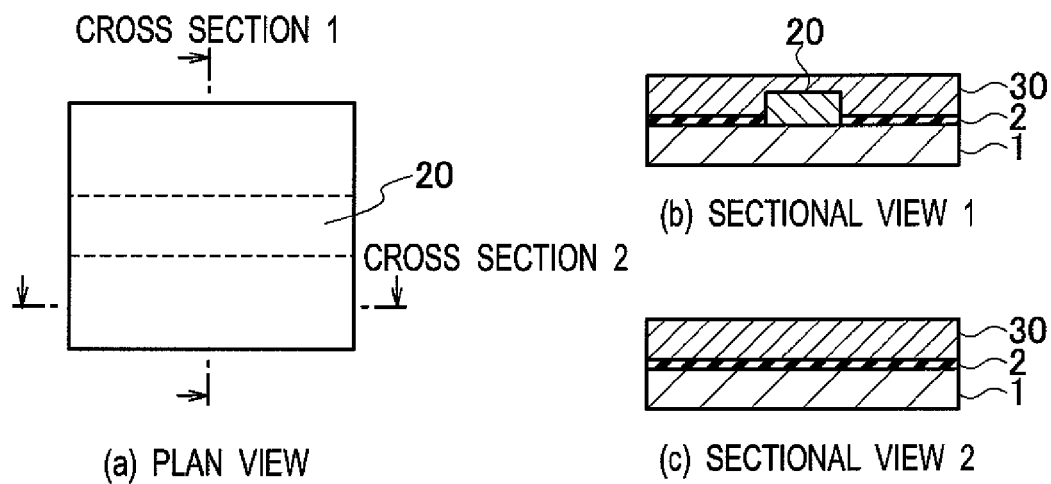
FIG. 9a, FIG. 9b and FIG. 9c are each a process chart of the formation of the floating gates, using the CMP of the polysilicon film.
Figure 10:
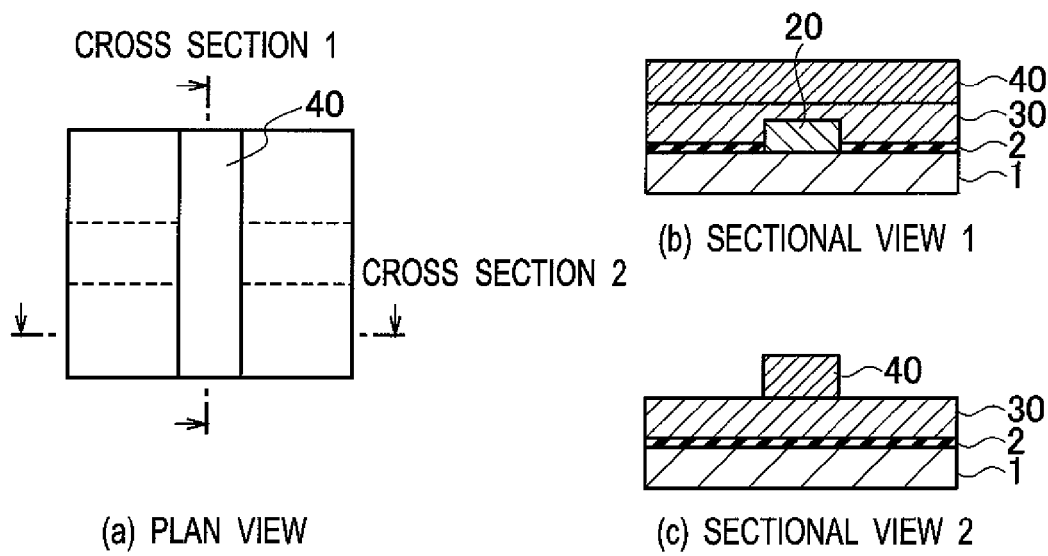
FIG. 10a, FIG. 10b and FIG. 10c are each a process chart of the formation of the floating gates, using the CMP of the polysilicon film.
Figure 11:
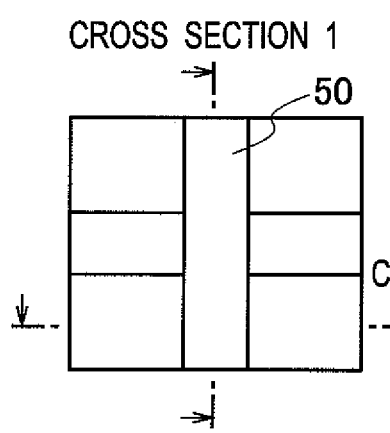
FIG. 11a, FIG. 11b and FIG. 11c are each a process chart of the formation of the floating gates, using the CMP of the polysilicon film.
Figure 11:
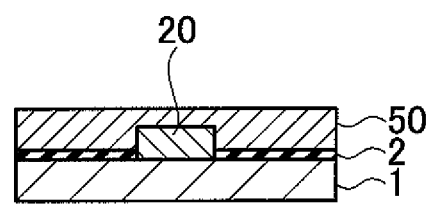
Figure 11:
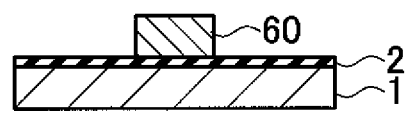

FIG. 4 shows relationships between the polish amount of the convexes (polish amount of the region where the remaining film thickness was measured) of the polysilicon film, and the planarity. The gradient of each of the straight lines corresponds to the ratio of the cancellation of the step difference to the polish amount of the convexes, that is, the planarization efficiency. From FIG. 4, it is understood that as the concentration of hydrogen peroxide is higher, the gradient of the straight line is larger so that the planarization efficiency is higher. The property that the remaining film thickness of the polysilicon film can easily be controlled as described herein when the polishing is automatically stopped is very effective for the CMP of floating gates of flash memories.

Examples 10 to 12

Production of CMP Slurries (X) to (XII) for Silicon Polishing

Individual components shown in Table 3 were mixed with each other to produce each of CMP slurries (X) to (XII) for silicon polishing.

About the colloidal silica (A) used in the CMP slurries (X) to (XI) for silicon polishing, the zeta potential at a pH of 7 was −25 mV. The average particle diameter of secondary particles of the colloidal silica was about 15 nm before the production of each of the CMP slurries for silicon polishing, and was from about 15 to 30 nm just after the production. Also after the slurry was allowed to stand still at room temperature for one month after the production, the average particle diameter thereof was from about 15 to 30 nm, which was hardly changed. About the colloidal silica (B) used in the CMP slurry (XII) for silicon polishing, the zeta potential at a pH of 7 was −35 mV. The average particle diameter of secondary particles of the colloidal silica was about 15 nm before the production of the CMP slurry for silicon polishing, and was from about 15 to 30 nm just after the production. Also after the slurry was allowed to stand still at room temperature for one month after the production, the average particle diameter thereof was from about 15 to 30 nm, which was hardly changed.

Hydrogen peroxide used as the oxidizing agent was hydrogen peroxide water having a concentration of 30% by mass, and ammonium persulfate (($NH_4$)$_2$$S_2$$O_8$) used as the oxidizing agent was a solution where powder thereof was dissolved in water, respectively. In Example 10, the concentration of the oxidizing agent relative to 100 parts by mass of the CMP slurry for silicon polishing was 6.0 parts by mass; in Example 11, that was 2.0 parts by mass; and in Example 12, that was 0.9 part by mass. The concentration of the cationic surfactant was 0.005 part by mass in Examples 10 to 11, and was 0.002 part by mass in Example 12.

<Evaluations of the CMP Slurries (X) to (XII) for Silicon Polishing>

The CMP slurries (X) to (XII) for silicon polishing, which were produced in Examples 10 to 12, respectively, were each used to make the same evaluations as in Example 1. The results are shown in Table 3.

TABLE 3

| | | | Examples | | |
|---|---|---|---|---|---|
| | | | 10 | 11 | 12 |
| CMP slurry for silicon film polishing | | | (X) | (XI) | (XII) |
| Composition of components (parts by mass) in the CMP slurry for silicon film polishing | Abrasive grains | Colloidal silica (A) | 4.0 | 4.0 | 0 |
| | | Colloidal silica (B) | 0 | 0 | 0.5 |
| | Oxidizing agent | Hydrogen peroxide | 6.0 | 0 | 0.9 |
| | | Ammonium persulfate | 0 | 2.0 | 0 |
| | Cationic surfactant | Dodecyltrimethylammonium chloride | 0.005 | 0.005 | 0.002 |
| | pH adjustor | Malic acid | 0.008 | 0 | 0 |
| | | Tetramethyl ammonium hydroxide | 0 | 0 | 0.0027 |
| | Water | | 89.987 | 93.995 | 98.5953 |
| pH of the CMP slurry for silicon film polishing | | | 5.5 | 5.9 | 7.5 |

TABLE 3-continued

|  |  | Examples | | |
|---|---|---|---|---|
|  |  | 10 | 11 | 12 |
| Characteristics | Dishing amount (nm) of the polysilicon film | | | |
|  | Remaining step difference (nm) of the polysilicon film | 20 | 40 | 50 |
|  | Remaining film thickness (nm) of the polysilicon film | 50 | 80 | 100 |
|  | End point detection period (seconds) | 75 | 50 | 60 |
|  | Polishing rate (nm/minute) of the polysilicon film | 120 | 140 | 100 |

In Example 10, wherein the pH was adjusted to 5.5, by the addition of 6.0 parts by mass of hydrogen peroxide, the polishing was automatically stopped. It is understood that both of the planarity and the polishing rate were good. It is understood from Example 11 that also when ammonium persulfate was used as the oxidizing agent, the polishing was automatically stopped so as to give good results. In Example 12, the colloidal silica (B) was used, and the concentration of the abrasive grains was set to 0.5 part by mass; then, good results were obtained in the same manner as in the other examples. It is understood that the use of the colloidal silica (B), which is lower in zeta potential than the silica (A), makes it possible to make the amount of the abrasive grains small and decrease slurry costs.

Comparative Examples 1 to 3

Production of CMP Slurries (XIII) to (XV) for Silicon Film Polishing

Individual components shown in Table 4 were mixed with each other to produce each of CMP slurries (XIII) to (XV) for silicon film polishing.

The colloidal silica used in the CMP slurries (XIII) to (XV) for silicon polishing was the same as in Example 1. In the CMP slurry (XIII) for silicon polishing, the concentration of the colloidal silica in the slurry was 4.0 parts by mass; and in the CMP slurries (XIV) and (XV) for silicon polishing, that was 5.0 parts by mass. The used polyacrylic acid was polyacrylic acid having a weight-average molecular weight of 5000, the molecular weight being a molecular weight in terms of polystyrene.

<Evaluations of the CMP Slurries (XIII) to (XV) for Silicon Polishing>

The CMP slurries (XIII) to (XV) for silicon polishing, which were produced in Comparative Examples 1 to 3, respectively, were each used to make the same evaluations as in Example 1. The results are shown in Table 4.

TABLE 4

|  |  |  | Comparative Examples | | |
|---|---|---|---|---|---|
|  |  |  | 1 | 2 | 3 |
| CMP slurry for silicon film polishing | | | (XIII) | (XIV) | (XV) |
| Composition of components (parts by mass) in the CMP slurry for silicon film polishing | Abrasive grains | Colloidal silica (A) | 4.0 | 5.0 | 5.0 |
|  | Oxidizing agent | Hydrogen peroxide | 0 | 0.3 | 0.9 |
|  | Cationic surfactant | Dodecyltrimethylammonium chloride | 0.005 | 0 | 0 |
|  | Anionic surfactant | Polyacrylic acid | 0 | 0.1 | 0.1 |
|  | pH adjustor | Malic acid | 0.005 | 0 | 0 |
|  |  | Tetramethyl ammonium hydroxide | 0 | 0.063 | 0.063 |
|  | Water | | 95.99 | 94.537 | 93.937 |
| pH of the CMP slurry for silicon film polishing | | | 6.7 | 6.7 | 6.7 |
| Characteristics | Dishing amount (nm) of the polysilicon film | | 80 | 80 | |
|  | Remaining step difference (nm) of the polysilicon film | | | | 65 |
|  | Remaining film thickness (nm) of the polysilicon film | | | | 80 |
|  | End point detection period (seconds) | | 55 | 165 | (180) |
|  | Polishing rate (nm/minute) of the polysilicon film | | 218 | 72 | 40 |

It is understood from Table 4 that in Comparative Example 1, wherein no oxidizing agent was contained, the polishing of the polysilicon film advanced until the SiO film as the underlay was made uncovered and the dishing amount was 80 nm to exhibit a bad planarity. It is understood that in Comparative Example 2, wherein no cationic surfactant was contained and the concentration of hydrogen peroxide was 0.3 part by mass, <Evaluations of the CMP Slurries (XVI) to (XX) for Silicon Polishing>

The CMP slurries (XVI) to (XX) for silicon polishing, which were produced in Comparative Examples 4 to 8, respectively, were each used to make the same evaluations as in Example 1. The results are shown in Table 5.

TABLE 5

| | | | Comparative Examples | | | | |
|---|---|---|---|---|---|---|---|
| | | | 4 | 5 | 6 | 7 | 8 |
| CMP slurry for silicon film polishing | | | (XVI) | (XVII) | (XVIII) | (IXX) | (XX) |
| Composition of components (parts by mass) in the CMP slurry for silicone film polishing | Abrasive grains | Colloidal silica (A) | 5.0 | 5.0 | 5.0 | 5.0 | 5.0 |
| | Oxidizing agent | Hydrogen peroxide | 0 | 0.03 | 0.15 | 0.15 | 0.45 |
| | pH adjustor | Tetramethyl ammonium hydroxide | 0.2 | 0.2 | 0.2 | 0.1 | 0.1 |
| | Anionic surfactant | Polyacrylic acid | 0.1 | 0.1 | 0.1 | 0.1 | 0.1 |
| | Water | | 94.7 | 94.67 | 94.55 | 94.65 | 94.35 |
| pH of the CMP slurry for silicon film polishing | | | 9.9 | 9.9 | 9.9 | 7.5 | 7.5 |
| Characteristics | Dishing amount (nm) of the polysilicon film | | 80 | 80 | | 85 | |
| | Remaining step difference (nm) of the polysilicon film | | | | 80 | | 65 |
| | Remaining film thickness (nm) of the polysilicon film | | | | 160 | | 150 |
| | End point detection period (seconds) | | 60 | 85 | (180) | 90 | (180) |
| | Polishing rate (nm/minute) of the polysilicon film | | 200 | 141 | 13 | 133 | 50 | the wafer was polished until the underlay was made uncovered and the dishing amount was 80 nm to exhibit a bad planarity. It is understood that: in Comparative Example 3, wherein no cationic surfactant was contained and the concentration of hydrogen peroxide was 0.9 part by mass, the polishing was not automatically stopped although the wafer was polished for 180 seconds; no end point was detected (this matter is represented as the end point detection period (180) in the table); the polishing rate was slow; and the planarity was also bad. Even when lauric acid or the like is used as an anionic surfactant instead of the polyacrylic acid, the same results are expected to be produced. Thus, it is understood that an anionic surfactant is not effective as the surfactant in the invention.

Comparative Examples 4 to 8

Production of the CMP Slurries (XVI) to (XX) for Silicon Polishing

Individual components shown in Table 5 were mixed with each other to produce each of CMP slurries (XVI) to (XX) for silicon polishing.

The colloidal silica used in each of the CMP slurries (XVI) to (XX) for silicon polishing was the same as in Example 1. In the CMP slurry, the concentration of the colloidal silica was set to 5.0 parts by mass. The used polyacrylic acid was polyacrylic acid having a weight-average molecular weight of 5000, the molecular weight being a molecular weight in terms of polystyrene. In Comparative Example 4, the concentration of hydrogen peroxide in the slurry for silicon polishing was 0 part by mass; that was 0.03 part by mass in Comparative Example 5; that was 0.15 part by mass in Comparative Examples 6 and 7; that was 0.45 part by mass in Comparative Example 8.

It is understood from Table 5 that in Comparative Example 4, wherein the concentration of hydrogen peroxide in the slurry was 0 part by mass, and Comparative Example 5, wherein that was 0.03 part by mass, the polysilicon film was polished until the SiO film as the underlay was made uncovered, and the dishing amount was as large as 80 nm. It is understood that: in Comparative Example 6, wherein the concentration of hydrogen peroxide in the slurry was 0.15 part by mass, the polishing was not automatically stopped although the wafer was polished for 180 seconds; no end point was detected (this matter is represented as the end point detection period (180) in the table); the polishing rate was slow; and the planarity was also bad. It is understood that as described above, in a slurry containing no cationic surfactant, the polishing rate of a polysilicon film is largely reduced by the addition of a small amount of hydrogen peroxide thereto, and thus the polishing rate is not easily controlled.

It is understood that in Comparative Examples 7 and 8, wherein the pH was adjusted to 7.5, a fall in the polishing rate by the addition of hydrogen peroxide was smaller than the cases where the pH was 9.9. However, in Comparative Example 7, the polishing of the polysilicon film advanced until the SiO film as the underlay was made uncovered, and the dishing amount after the polishing was as large as 85 nm. It is understood that: in Comparative Example 8, wherein the concentration of hydrogen peroxide in the slurry was 0.45 part by mass, the polishing was not automatically stopped although the wafer was polished for 180 seconds; no end point was detected (this matter is represented as the end point detection period (180) in the table); the polishing rate was slow; and the planarity was also bad.

Comparative Examples 4 to 8 were examples described in Japanese Patent No. 3457144, which is a prior technique, wherein an investigation was made about the case of incorporating an oxidizing agent into a composition for polysilicon film polishing containing a basic organic material. It has been understood that according to the addition of the oxidizing agent, the planarity is not improved although the polishing rate of a polysilicon film is lowered. Therefore, for an improvement in the planarity by the addition of an oxidizing agent, a cationic surfactant is essential.

The invention is not limited to the above-mentioned individual examples, and it is evident that within the scope of the technical conception of the invention, the examples may be appropriately modified and used in any other field to which CMP processing is applicable.

INDUSTRIAL APPLICABILITY

According to the invention, it is possible to provide a CMP slurry for silicon film polishing that is very good in the planarity of a surface polished therewith and in the performance of controlling the remaining film thickness, and a polishing method using the slurry. Thus, according to the invention, it is possible to improve the yield of semiconductor elements and the reliability thereof, and decrease the production costs.

The invention claimed is:

1. A polishing method for a substrate, wherein the substrate comprises: an underlay comprising concaves and convexes; and a silicon film formed on the underlay, the silicon film having a surface with a step structure,
   comprising the steps of: polishing the silicon film; and
   stopping the polishing before the underlay is made uncovered,
   wherein a CMP slurry for silicon film polishing is used to perform the polishing, the CMP slurry having a property of lowering a polishing rate and then automatically stopping polishing after the surface of the silicon film, with the step structure, is planarized, and before the underlay is uncovered, the CMP slurry comprising:
   abrasive grains, an oxidizing agent, a cationic surfactant, and water,
   wherein the CMP slurry has a pH within the range of 4 to 9,
   wherein the content of the oxidizing agent is from 0.3 to 20.0 parts by mass relative to 100 parts by mass of the CMP slurry for the silicon film polishing, and
   wherein the cationic surfactant is at least one selected from the group consisting of the following (A) to (E):
   (A) a quaternary ammonium salt cationic surfactant selected from the group consisting of monoalkyltrimethylammonium salts represented by a formula $(R(CH_3)_3N.X)$; dialkyldimethylammonium salts represented by a formula $((R)_2N(CH_3)_2N.X)$; alkylbenzyldimethylammonium salts represented by a formula $(R(CH_2Ph)(CH_3)_2N.X)$; alkyl pyridinium salts represented by a formula $(PyR.X)$; and chlorinated benzethonium salts represented by a formula $(R.PhO(CH_2)_2O(CH_2)N(CH_3)_2CH_2Ph.X)$, wherein each R is an alkyl or alkylene group having 8 to 18 carbon atoms, Ph is a phenyl group, and Py is a pyridinium group,
   (B) a compound selected from the group consisting of methonium dihydroxide and a salt thereof represented by a formula $(N(CH_3)_3X)C_nH_{2n}(N(CH_3)_3X)$, wherein $C_nH_{2n}$ is an alkyl or alkylene group having 8 to 18 carbon atoms,
   (C) an alkylamideamine salt represented by a formula $(R_1CONH(CH_2)_nN(R_2)(R_3).X)$, wherein $R_1$ is an alkyl group having 8 to 18 carbon atoms, and $R_2$ and $R_3$ are each an alkyl group having 1 to 4 carbon atoms,
   wherein, in each of (A) to (C), X is a minus ion,
   (D) an aliphatic amine selected from the group consisting of octylamine, decylamine, dodecylamine, tetradecylamine, hexadecylamine, methyldodecylamine, and dimethyldodecylamine, and
   (E) an aliphatic diamine having at each terminal of its alkyl chain a cationic hydrophilic group, or a salt thereof.

2. The polishing method according to claim 1, wherein the oxidizing agent is hydrogen peroxide.

3. The polishing method according to claim 1, wherein the content of the oxidizing agent is from 0.6 to 20.0 parts by mass relative to 100 parts by mass of the CMP slurry for silicon film polishing.

4. The polishing method according to claim 1, wherein the content of the cationic surfactant is from 0.0001 to 0.1 part by mass relative to 100 parts by mass of the CMP slurry for silicon film polishing.

5. The polishing method according to claim 4, wherein said content of the cationic surfactant is 0.001 to 0.025 part by mass relative to 100 parts by mass of the CMP slurry.

6. The polishing method according to claim 1, wherein the silicon film, with the step structure, that is polished, is a polysilicon film or an amorphous silicon film.

7. The polishing method according to claim 6, wherein the silicon film, having the step structure, that is polished, is a polysilicon film.

8. The polishing method according to claim 1, wherein X is selected from the group consisting of Cl, Br, I, $NO_3$, $CH_3COO$ and OH, which are each a minus ion.

9. The polishing method according to claim 1, wherein each of R and $C_nH_{2n}$ is an alkyl or alkylene group having 10 to 14 carbon atoms.

10. The polishing method according to claim 1, wherein said pH of the CMP slurry is within the range of 4 to 6.7.

11. The polishing method according to claim 1, wherein the content of the oxidizing agent is 0.6 to 15.0 parts by mass relative to 100 parts by mass of the CMP slurry for silicon film polishing.

12. The polishing method according to claim 1, wherein the content of the oxidizing agent is 0.9 to 10.0 parts by mass relative to 100 parts by mass of the CMP slurry for silicon film polishing.

13. The polishing method according to claim 1, wherein the content of the oxidizing agent is 0.9 to 6.0 parts by mass relative to 100 parts by mass of the CMP slurry for silicon film polishing.

* * * * *